United States Patent
Takahashi (10) Patent No.: US 11,690,163 B2
(45) Date of Patent: Jun. 27, 2023

(54) PARTICLE ACCELERATOR SYSTEM

(71) Applicant: SUMITOMO HEAVY INDUSTRIES, LTD., Tokyo (JP)

(72) Inventor: Nobuaki Takahashi, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 164 days.

(21) Appl. No.: 16/918,676

(22) Filed: Jul. 1, 2020

(65) Prior Publication Data
US 2021/0007211 A1 Jan. 7, 2021

(51) Int. Cl.
H05H 7/02 (2006.01)
H05H 13/00 (2006.01)
H03F 3/24 (2006.01)

(52) U.S. Cl.
CPC .............. H05H 7/02 (2013.01); H03F 3/245 (2013.01); H05H 13/005 (2013.01); *H05H 2007/025* (2013.01)

(58) Field of Classification Search
CPC .. H05H 7/02; H05H 13/005; H05H 2007/025; H03F 3/245; H03F 1/526; H03F 2200/451; H03F 2203/21196; H03F 3/19; H03F 3/211
See application file for complete search history.

(56) References Cited

U.S. PATENT DOCUMENTS

| | | | |
|---|---|---|---|
| 2014/0037065 A1* | 2/2014 | Botto | H05H 9/005 324/333 |
| 2015/0137890 A1* | 5/2015 | Nobbe | H03F 3/19 330/295 |
| 2020/0169229 A1* | 5/2020 | Bäcklund | H03F 3/245 |

FOREIGN PATENT DOCUMENTS

CN 109819577 A * 5/2019

OTHER PUBLICATIONS

Translation of CN-109819577-A, May 2019 (Year: 2019).*
J. Jacob et al., "352.2 MHz—150 KW Solid State Amplifiers at the ESRF" Proceedings of IPAC2011, Paper No. MOPC005, 07 Accelerator Technology, T08 RF Power Sources, Sep. 2011, pp. 71-73, San Sebastian, Spain, 2011 by IPAC'11/EPS-AG.

* cited by examiner

*Primary Examiner* — Renan Luque
(74) *Attorney, Agent, or Firm* — Michael Best & Friedrich LLP (57) ABSTRACT

A particle accelerator system including a particle accelerator that accelerates charged particles, a signal source that outputs high frequency power for accelerating the charged particles in the particle accelerator, an amplifying unit that amplifies the high frequency power from the signal source, and supplies the high frequency power to the particle accelerator, the amplifying unit including a plurality of semiconductor amplifiers using a semiconductor, and a control unit that controls an operation of the amplifying unit. The control unit controls output of at least one of the plurality of semiconductor amplifiers.

8 Claims, 8 Drawing Sheets

PARTICLE ACCELERATOR SYSTEM

RELATED APPLICATIONS

The content of Japanese Patent Application No. 2019-123141, on the basis of which priority benefits are claimed in an accompanying application data sheet, is in its entire incorporated herein by reference.

BACKGROUND

Technical Field

A certain embodiment of the present invention relates to a particle accelerator system.

Description of Related Art

A particle accelerator system that accelerates charged particles and outputs a charged particle beam is known. The particle accelerator accelerates charged particles passing through an acceleration space by using high frequency power. Here, an amplifier described in the related art is known as an amplifier for supplying high frequency power.

SUMMARY

According to an embodiment of the present invention, there is provided a particle accelerator system including a particle accelerator that accelerates charged particles, a signal source that outputs high frequency power for accelerating the charged particles in the particle accelerator, an amplifying unit that amplifies the high frequency power from the signal source, and supplies the high frequency power to the particle accelerator, the amplifying unit including a plurality of semiconductor amplifiers using a semiconductor, and a control unit that controls an operation of the amplifying unit. The control unit controls output of at least one of the plurality of semiconductor amplifiers.

DETAILED DESCRIPTION

Since a particle accelerator requires a large amount of power, in a case where an amplifier is used to supply power to a power particle accelerator, a large number of amplifiers are required. However, as the number of used amplifiers increases, the frequency with which any amplifier in the system fails increases by the number of the used amplifiers. When any of amplifier in the system fails, it is necessary to deal with the failure. Therefore, when a failure frequency increases, the frequency of failure handling also increases. For example, in a case where the operation of the particle accelerator is stopped when the amplifier fails, the more the number of the amplifiers, the more the operation stop increases in frequency, and an operating efficiency of the particle accelerator is reduced.

Therefore, in the present invention, it is desirable to provide a particle accelerator system capable of improving the operating efficiency of the particle accelerator.

The control unit controls the output of at least one of the plurality of semiconductor amplifiers based on the number of usable semiconductor amplifiers.

The particle accelerator system according to the present invention includes the amplifying unit that amplifies the high frequency power from the signal source and supplies the high frequency power to the amplifying unit. The amplifying unit also includes a plurality of semiconductor amplifiers using a semiconductor for amplifying the high frequency power from the signal source. By adopting the plurality of semiconductor amplifiers using the semiconductor, the amplifying unit can amplify the high frequency power from the signal source in parallel with the plurality of semiconductor amplifiers. Here, for example, when parts of the plurality of the semiconductor amplifiers fail and become unusable, the high frequency power supplied to the particle accelerator decreases. On the other hand, the control unit controls the output at least one of the plurality of semiconductor amplifiers. The control unit controls the output so that the remaining non-failed semiconductor amplifiers, that is, the usable semiconductor amplifiers, supplement the output of the failed semiconductor amplifier. Accordingly, the amplifying unit is capable of continuingly supplying the high frequency power required for operating the particle accelerator without stopping the particle accelerator. As described above, it is possible to improve the operating efficiency of the particle accelerator.

The amplifying unit includes a first amplifying unit that amplifies the high frequency power from the signal source, a second amplifying unit that includes the plurality of semiconductor amplifiers, and a distribution unit that distributes output of the first amplifying unit to each of the semiconductor amplifiers of the second amplifying unit. The control unit may control an amplification factor in the first amplifying unit according to the number of usable semiconductor amplifiers. Accordingly, the control unit can collectively control the plurality of semiconductor amplifiers only by controlling the output of the first amplifying unit. In this case, when controlling the individual semiconductor amplifiers, the control of output becomes easy.

The amplifying unit includes a first amplifying unit that amplifies the high frequency power from the signal source, a second amplifying unit that includes the plurality of semiconductor amplifiers, and a distribution unit that distributes output of the first amplifying unit to each of the semiconductor amplifiers of the second amplifying unit. The control unit controls an amplification factor in each of the semiconductor amplifiers of the second amplifying unit according to the number of usable semiconductor amplifiers.

The particle accelerator system further includes a failure detection unit that detects a failure of the plurality of semiconductor amplifiers. The control unit may control output of each of the semiconductor amplifiers based on a detection result of the failure detection unit. In this case, the control unit can directly identify the failure status of the plurality of semiconductor amplifiers and then control the output of the semiconductor amplifiers.

The amplifying unit includes a combiner that combines output from each of the semiconductor amplifiers, and thus, it is possible to supply a large amount of power to the particle accelerator.

The particle accelerator is a cyclotron. The cyclotron has a cavity to which the high frequency power amplified by the amplifying unit is supplied. The cavity is provided with a voltage detection unit that detects a voltage in the cavity. In a case where the voltage detected by the voltage detection unit decreases due to a presence of an unusable semiconductor amplifier, the control unit may control output of each of the semiconductor amplifiers such that the voltage becomes a predetermined set value. In this way, the control unit controls the output of the semiconductor amplifier based on the voltage in the cavity, so that the voltage required in the cavity can be accurately ensured.

Hereinafter, embodiments of a particle accelerator system according to the present invention will be described in detail with reference to the drawings.

Figure 1:
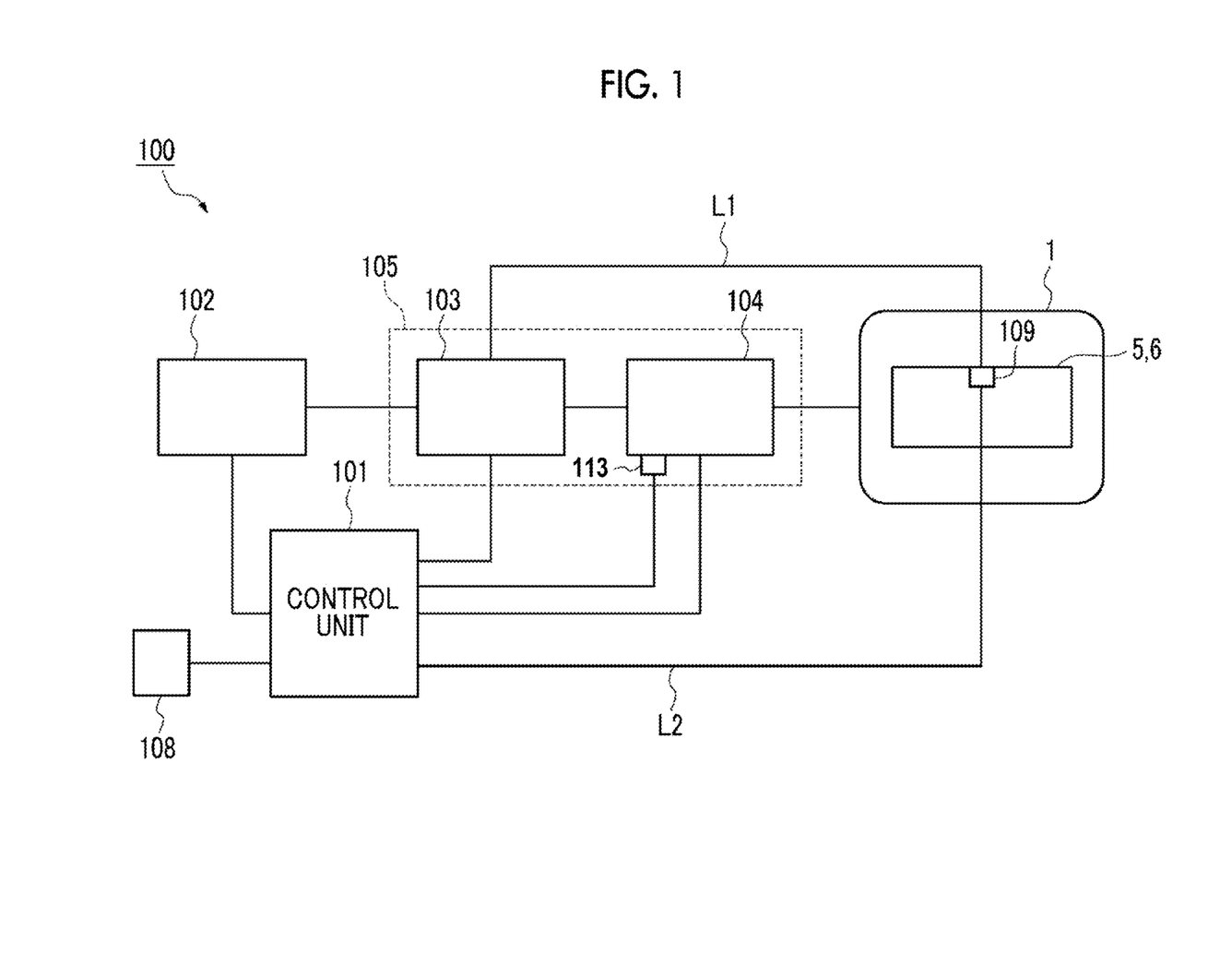
FIG. 1 is a block diagram showing a particle accelerator system according to an embodiment of the present invention.

FIG. 1 is a system configuration diagram showing a configuration of the particle accelerator system according to the present embodiment. As shown in FIG. 1, the particle accelerator system 100 includes a control unit 101, a signal source 102, an amplifying unit 105, and a cyclotron 1 (particle accelerator).

Figure 2:
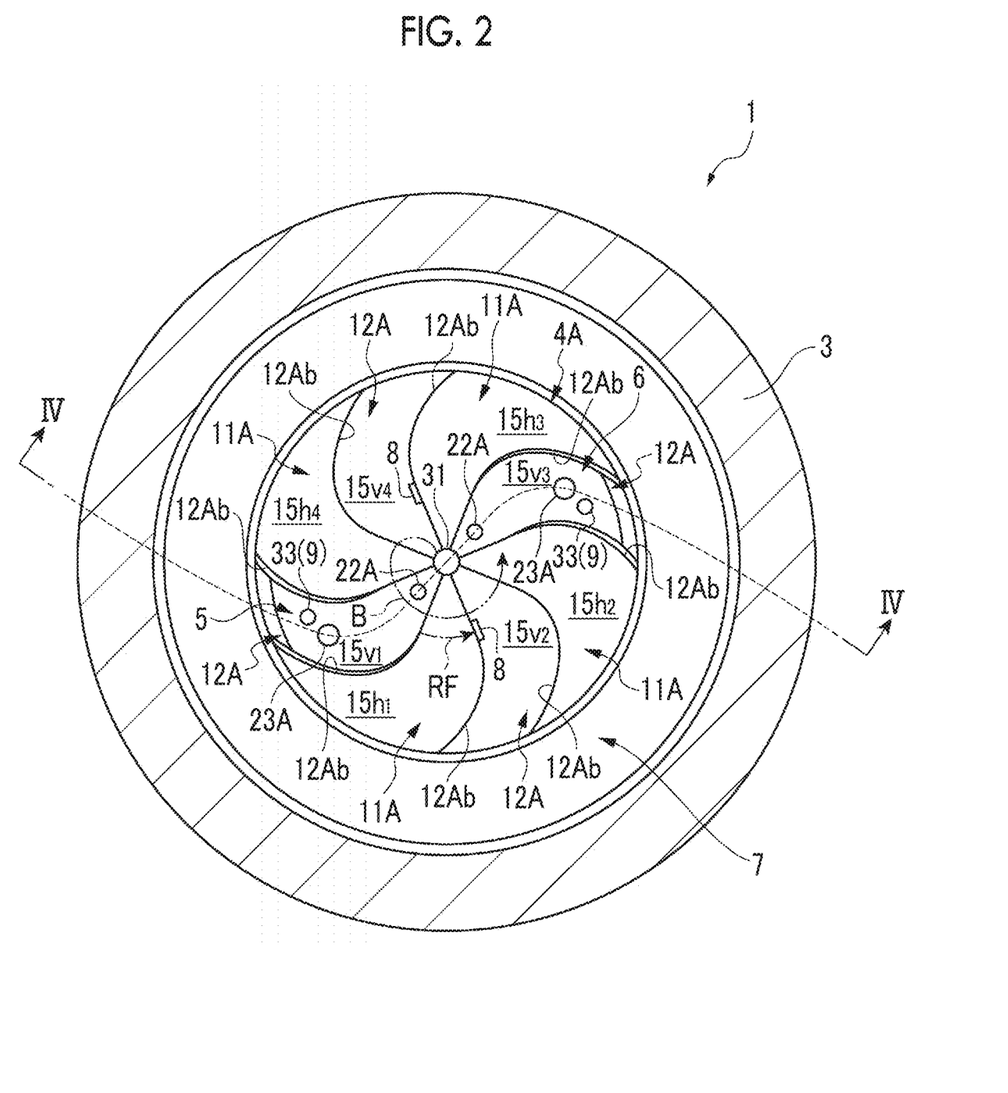
FIG. 2 is a plan view of an inside of a cyclotron.
Figure 3:
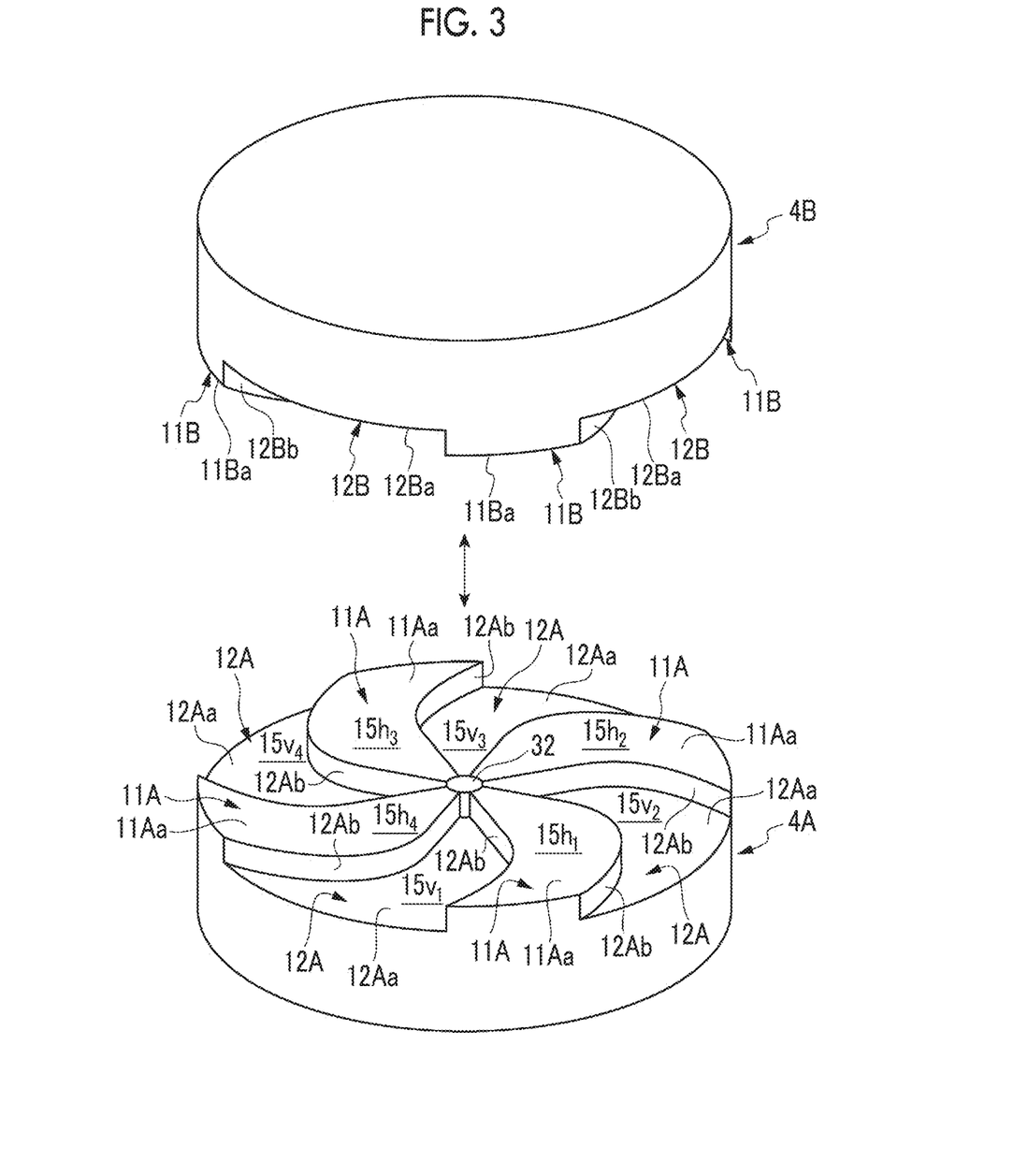
FIG. 3 is a schematic diagram of a pair of poles included in the cyclotron of FIG. 2.
Figure 4:
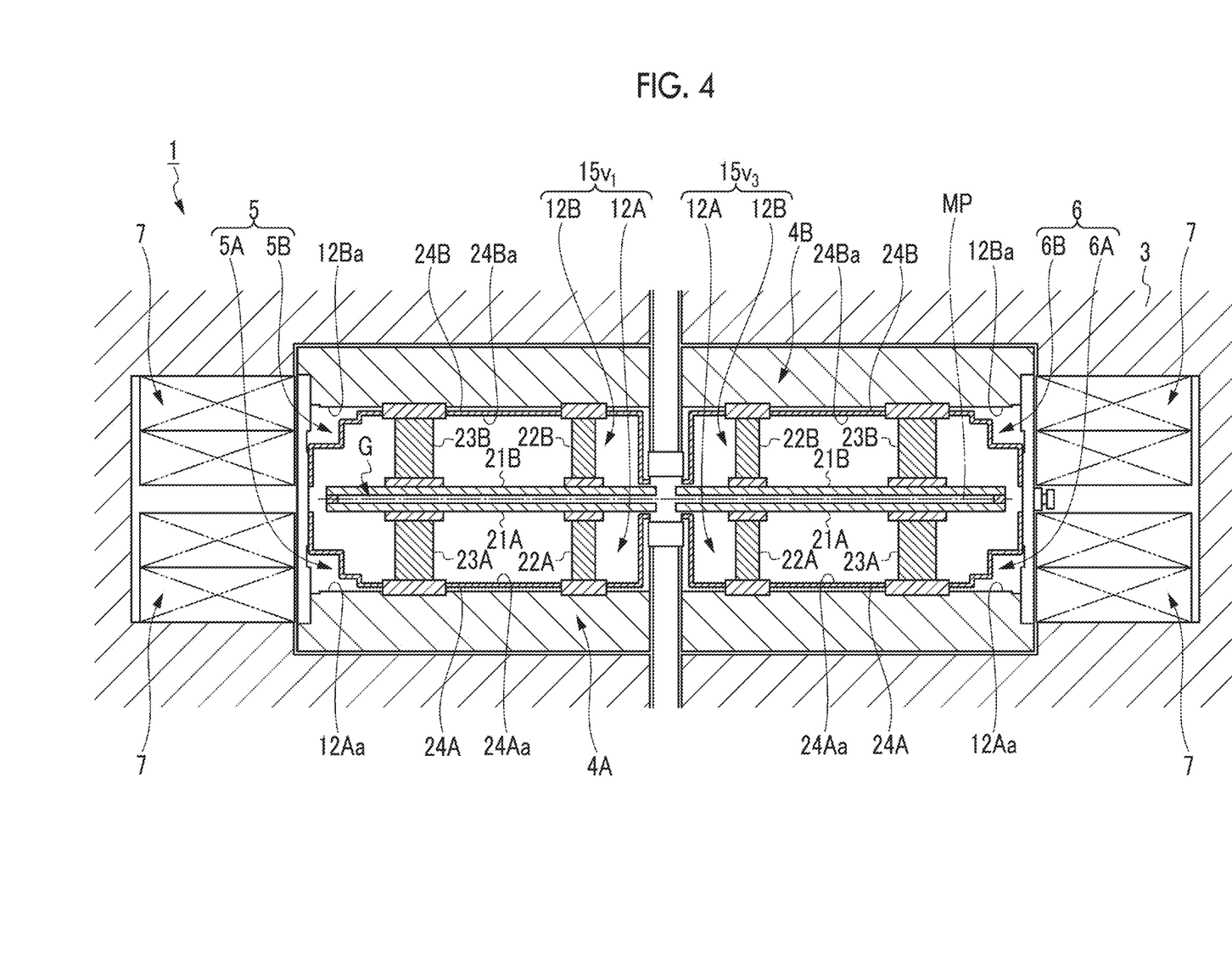
FIG. 4 is a cross-sectional view taken along a line IV-IV shown in FIG. 2.
Figure 5:
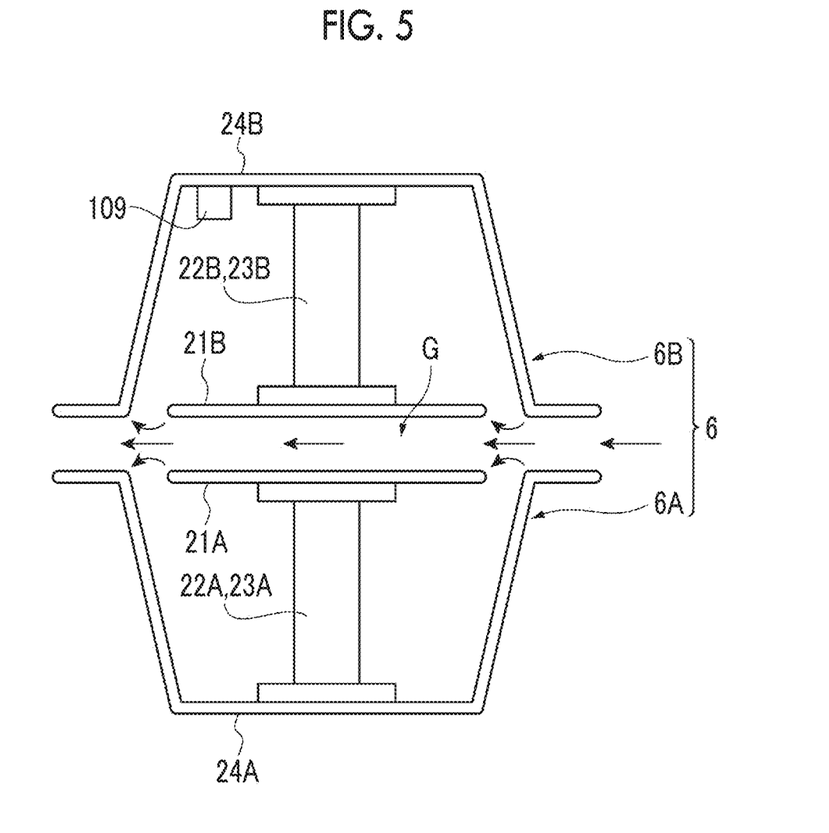
FIG. 5 is a schematic configuration diagram of a cavity viewed from a radial direction.

First, the configuration of the cyclotron 1 will be described with reference to FIGS. 2 to 5. FIG. 2 is a plan view of the inside of the cyclotron 1. FIG. 3 is a schematic diagram of pairs of poles 4A and 4B included in the cyclotron 1 of FIG. 1. FIG. 4 is a cross-sectional view taken along a line IV-IV shown in FIG. 2. FIG. 4 is a cross-sectional view taken along a line (indicated by a broken line in FIG. 2) indicating a center position in a circumferential direction of the valley. FIG. 5 is a schematic configuration diagram of the cavity 6 viewed from the radial direction.

The cyclotron 1 is a circular accelerator that supplies charged particles from an ion source (not shown) into an acceleration space G, accelerates the charged particles in the acceleration space G, and outputs a charged particle beam. In the cyclotron 1 of the present embodiment, it is assumed that a spiral orbit B of the charged particle beam is on a horizontal plane. The cyclotron of the present invention may be disposed such that the orbit B is on the vertical plane. Examples of the charged particles include protons and heavy particles (heavy ions). The cyclotron 1 is used, for example, as an accelerator for charged particle beam therapy. In the present embodiment, an Azimuthally Varying Field (AVF) cyclotron, which is a cyclotron that forms a magnetic flux density having strength and weakness in the circumferential direction, will be described as an example.

As shown in FIGS. 2 to 5, the cyclotron 1 includes a yoke 3, pairs of poles 4A and 4B, cavities 5 and 6, and a coil 7.

The yoke 3 supports the vacuum container or the coil 7. The vacuum container is a container for maintaining the acceleration space of the charged particles in a high-vacuum state. The pairs of poles 4A and 4B functioning as magnetic poles for forming a magnetic field required for particle acceleration are provided in the yoke 3. The poles 4A and 4B have a circular shape in a plan view and have a vertically symmetrical shape with respect to the median plane MP (the plane on which the orbit B where the charged particle beam accelerates and travels is located, which is shown by a dashed line in FIG. 4). The coils 7 are disposed around each of the poles 4A and 4B, and a magnetic field is generated between the pole 4A and the pole 4B.

FIG. 3 is a perspective view schematically showing only the poles 4A and 4B. As shown in FIG. 3, the poles 4A and 4B have a cylindrical shape. The terms "radial direction" and "circumferential direction" used below mean the radial direction and the circumferential direction of a circle that is the contour shape of the poles 4A and 4B when viewed from the direction of FIG. 2. On an upper surface of the pole 4A, a plurality of (four in the present embodiment) hills 11A that are spirally curved protrusions and a plurality of (four in the present embodiment) valleys 12A that are recessed portions are alternately disposed in the circumferential direction. On a lower surface of the pole 4B, a plurality of (four in the present embodiment) hills 11B that are spirally curved protrusions, and a plurality of (four in this embodiment) valleys 12B that are recessed portions are alternately disposed in the circumferential direction and formed. The hills 11A and 11B and the valleys 12A and 12B are disposed with a gap so as to be plane-symmetric with respect to the median plane MP. Note that, the hills 11A and 11B of the poles 4A and 4B are protrude toward the median plane MP, and the valleys 12A and 12B are recessed to be away from the median plane MP. The shapes of the hills 11A and 11B and the valleys 12A and 12B are not limited to the above-described spirally curved shape, and may be fan-shaped.

A narrow gap hill region $15h$ sandwiched between the hills 11A and 11B and a wide gap valley region $15v$ sandwiched between the valleys 12A and 12B are formed between the poles 4A and 4B. The spiral orbit B of the charged particle beam is formed on the symmetry plane of the poles 4A and 4B (the median plane MP). The valley regions $15v_1$, $15v_2$, $15v_3$, and $15v_4$ are formed and the hill regions $15h_1$, $15h_2$, $15h_3$, and $15h_4$ are formed in order in the circumferential direction.

The cavities 5 and 6 generate an electric field of high frequency for accelerating the charged particles. The cavities 5 and 6 are disposed between the valleys 12A and 12B of the pairs of poles 4A and 4B (valley regions $15v_1$ and $15v_3$), and high frequency power is supplied from the high frequency power source (not shown). The cavities 5 and 6 are set to generate an electric field having a predetermined frequency (resonance frequency). One cavity 5 is disposed in one valley region $15v_1$ among the plurality of (four in the present embodiment) valley regions $15v$, and the other cavity 6 is disposed in the valley region $15v_3$ on the opposite side of the valley region $15v_1$ in which one cavity 5 is disposed with a center line interposed therebetween (refer to FIG. 2). In addition, as shown in FIG. 4, the cavity 5 has a lower cavity 5A and an upper cavity 5B, and the cavity 6 has a lower cavity 6A and an upper cavity 6B. The lower cavities 5A and 6A are disposed in the valley 12A of the lower pole 4A. The upper cavities 5B and 6B are disposed in the valley 12B of the upper pole 4B.

The lower cavities 5A and 6A are provided with a dee electrode (accelerating electrode) 21A, inner conductors (stems) 22A and 23A, and an outer conductor 24A. The upper cavities 5B and 6B are provided with a dee electrode (accelerating electrode) 21B, inner conductors (stems) 22B and 23B, and an outer conductor 24B.

The dee electrodes 21A and 21B are electrodes that generate an electric field for accelerating the charged particles inside the vacuum container. Both the dee electrodes 21A and 21B are disposed in the valley regions $15v_1$ and $15v_3$, and are disposed so as to face each other in the vertical direction. The dee electrodes 21A and 21B are formed in a shape along with the shapes of the valley regions $15v_1$ and $15v_3$ in a plan view. The dee electrodes 21A and 21B are separated from the bottom surfaces 12Aa and 12Ba of the valleys 12A and 12B, and are disposed at approximately the same position as the protruding surfaces 11Aa and 11Ba of the hills 11A and 11B so as to form an acceleration space G formed near the median plane MP. At the center of the pole 4A, an inflector (not shown) that deflects charged particles sent from an ion source (not shown) provided outside or inside the cyclotron 1 and sends the deflected charged particles to the median plane MP is disposed. In a case where an internal ion source is used, the inflector is unnecessary. The outer conductors 24A and 24B are provided so as to surround the dee electrodes 21A and 21B. The outer conductors 24A and 24B have wall portions 24Aa and 24Ba that extend along at least the bottom surfaces 12Aa and 12Ba of the valleys 12A and 12B and face the dee electrodes 21A and 21B in the vertical direction. The inner conductors 22A and 22B extend in the vertical direction and connect the dee electrodes 21A and 21B to the wall portions 24Aa and 24Ba of the outer conductors 24A and 24B. The inner conductors 23A and 23B extend in the vertical direction and connect the dee electrodes 21A and 21B to the wall portions 24Aa and 24Ba of the outer conductors 24A and 24B. The inner conductors 22A and 22B are provided in regions on the inner peripheral side of the valley regions $15v_1$ and $15v_3$, and the inner conductors 23A and 23B are provided in regions on the outer peripheral side of the valley regions $15v_1$ and $15v_3$.

In the cyclotron 1, the charged particle beam is accelerated and travels the spiral orbit B on the median plane MP by generating a magnetic field between the poles 4A and 4B, and supplying the high frequency power to the cavities 5 and 6. The charged particle beam reaching the outer peripheral side in the radial direction passes through a magnetic channel or a deflector (not shown), and is extracted to the outside through a beam extraction duct.

As shown in FIG. 5, the cavity 6 is provided with a voltage detection unit 109. The voltage detection unit 109 detects the voltage in the cavity 6. A loop antenna may be adopted as the voltage detection unit 109. The voltage detection unit 109 constituted by such a loop antenna is attached to the outer conductor 24B of the upper cavity 6B, and is installed near the inner conductors 22B and 23B having a large magnetic flux in the cavity 6. However, a sensor other than the loop antenna may be adopted as the voltage detection unit 109. The voltage detection unit 109 may be provided in the lower cavity 6A. The voltage may be monitored at a plurality of locations in the cavity 6 by providing a plurality of voltage detection units 109 in the cavity 6. The voltage detection unit 109 is also provided in the cavity 5. The voltage detection unit 109 is electrically connected to the first amplifying unit 103 and the control unit 101, and transmits the detection result to the first amplifying unit 103 and the control unit 101.

Returning to FIG. 1, a configuration for supplying the high frequency power to the cavities 5 and 6 of the cyclotron 1 as described above will be described. The particle accelerator system 100 supplies the high frequency power to the cavities 5 and 6 by using the signal source 102 and the amplifying unit 105. A set of the signal source 102 and the amplifying unit 105 is provided for the cavities 5 and 6. The high frequency power from the set of the signal source 102 and the amplifying unit 105 is supplied to one of the cavities 5 and 6. By supplying the high frequency power to one cavity, the high frequency power is automatically supplied to the other cavity.

The signal source 102 outputs high frequency power of a specific frequency. Although the signal source 102 can output only a small amount of power, the signal source 102 can output high frequency power of which frequency is exactly adjusted to a desired value. The signal source 102 outputs high frequency power having a frequency of about 100 MHz. The signal source 102 is electrically connected to the control unit 101, and outputs the high frequency power having a desired frequency based on a control signal from the control unit 101. The signal source 102 outputs the high frequency power to the first amplifying unit 103 of the amplifying unit 105.

Figure 6:
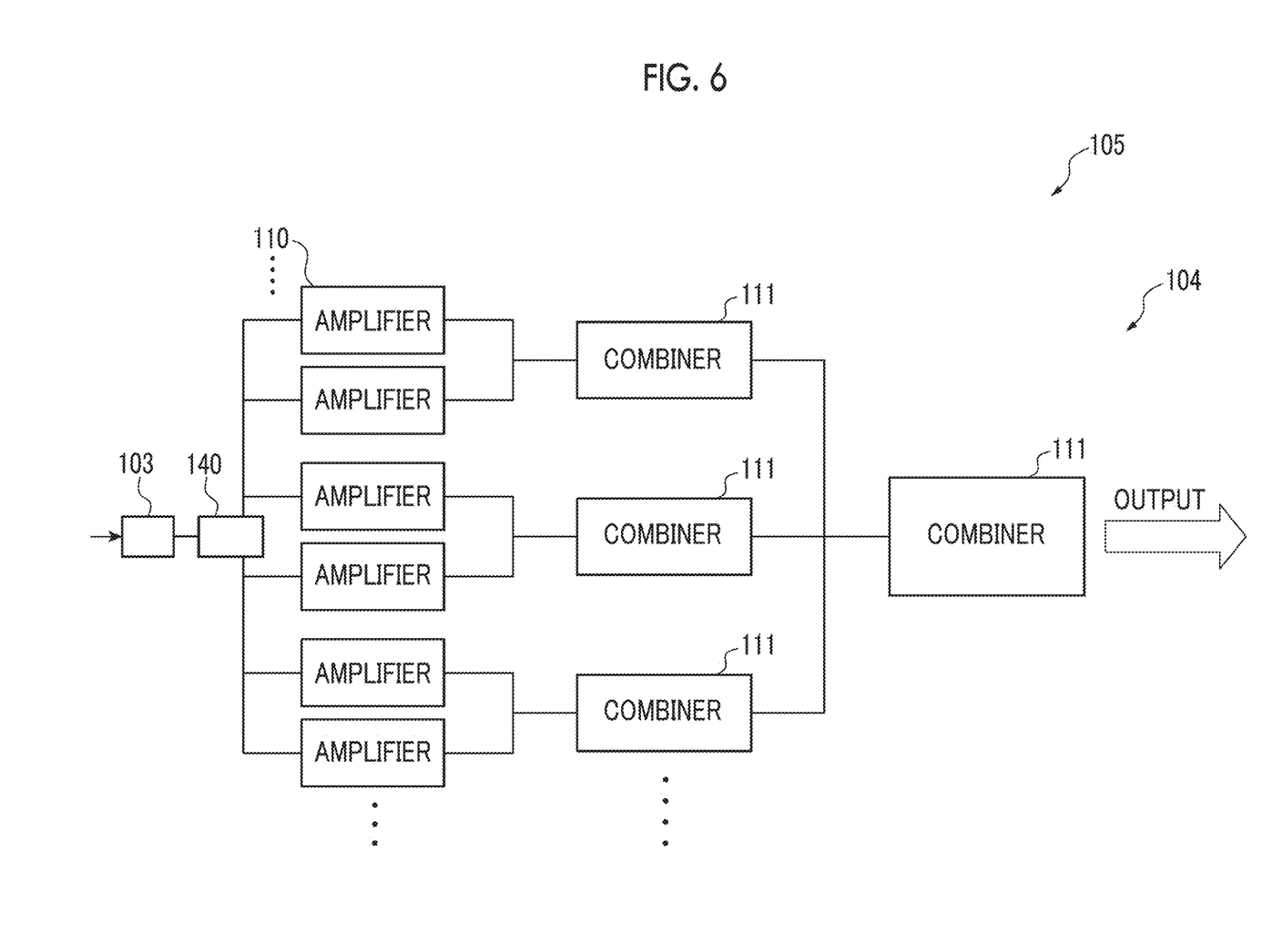
FIG. 6 is a block diagram showing a detailed configuration of an amplifying unit.
Figure 7:
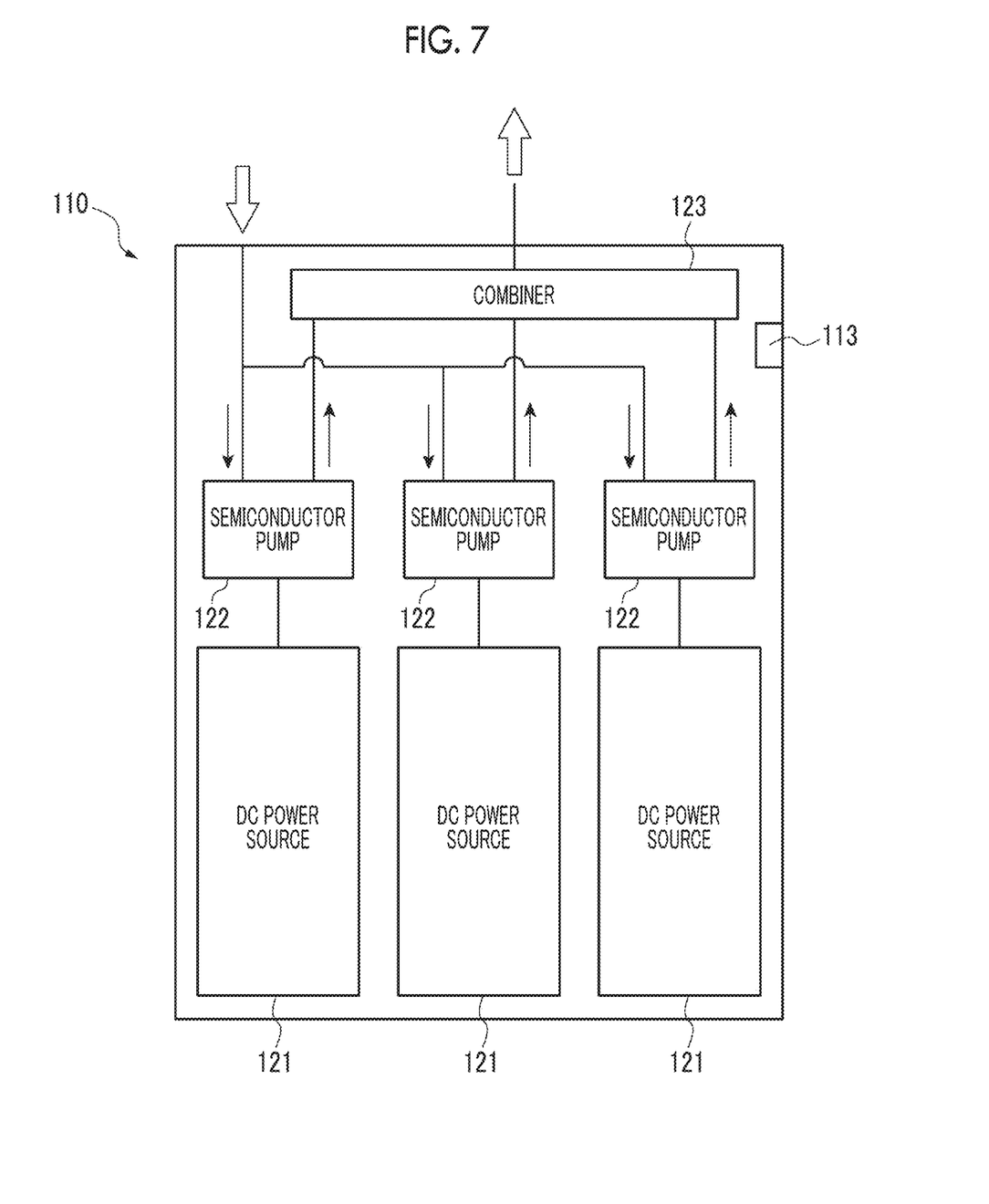
FIG. 7 is a block diagram showing an internal configuration of an amplifier.

The amplifying unit 105 is a device that amplifies high frequency power from the signal source 102. A configuration of the amplifying unit 105 will be described with reference to FIGS. 6 and 7. FIG. 6 is a block diagram showing a detailed configuration of the amplifying unit 105. FIG. 7 is a block diagram showing an internal configuration of the amplifier 110. As shown in FIG. 6, the amplifying unit 105 includes a first amplifying unit 103, a second amplifying unit 104, and a distribution unit 140.

The first amplifying unit 103 is an amplifying unit called a preamplifier, which amplifies the high frequency power from the signal source 102 and adjusts the power. A preamplifier using a semiconductor may be adopted as the first amplifying unit 103. The first amplifying unit 103 outputs the amplified high frequency power to the distribution unit 140. In addition, the first amplifying unit 103 is electrically connected to the voltage detection unit 109 (refer to FIG. 5) in the cavities 5 and 6. Accordingly, the voltage in the cavities 5 and 6 is fed back to the first amplifying unit 103.

The distribution unit 140 distributes the output (amplified high frequency power) of the first amplifying unit 103 to each amplifier 110 of the second amplifying unit 104. The distribution unit 140 is connected in parallel with the plurality of amplifiers 110 and distributes the high frequency power to the plurality of amplifiers 110.

The second amplifying unit 104 is an amplifying unit called a main amplifier. The second amplifying unit 104 amplifies the high frequency power adjusted by the first amplifying unit 103 to a size required for accelerating the charged particles in the cavities 5 and 6 of the cyclotron 1. The second amplifying unit 104 includes a plurality of amplifiers 110 using a semiconductor, and a combiner 111 that combines output from each amplifier 110. The number of the amplifiers 110 included in the second amplifying unit 104 is not particularly limited, and may be appropriately changed depending on the size of the high frequency power required in the cavities 5 and 6. For example, the second amplifying unit 104 includes about 10 to 50 amplifiers 110.

Each amplifier 110 amplifies the output from the first amplifying unit 103 distributed by the distribution unit 140. The combiner 111 combines the output from the plurality of amplifiers 110. The combiner 111 may combine the output from the amplifier 110 in a plurality of stages. For example, in the example shown in FIG. 6, the combiner 111 in a first-stage is connected in parallel with the two amplifiers 110, and combines the output from the two amplifiers 110. The combiner 111 in a second-stage is connected in parallel with the plurality of combiners 111 in the first-stage. The combiner 111 in the second-stage outputs the high frequency power obtained by combining the output from the entire amplifier 110 to the cavities 5 and 6, by combining the output from the plurality of the combiners 111.

As shown in FIG. 7, each amplifier 110 includes a plurality of semiconductor amplifiers 122. A DC power source 121 is connected to each semiconductor amplifier 122, and DC power is supplied from the DC power source 121. The high frequency power distributed by the distribution unit 140 is input to the plurality of semiconductor amplifiers 122. Accordingly, each semiconductor amplifier 122 amplifies the input high frequency power and outputs it to the combiner 123. The combiner 123 is connected in parallel with the plurality of semiconductor amplifiers 122, and thus combines the output from each semiconductor amplifier 122. Accordingly, the combiner 123 outputs the high frequency power obtained by combining the output from the plurality of semiconductor amplifiers 122 as the high frequency power amplified by each amplifier 110. The amplifier 110 also includes electronic components such as a fan in addition to the semiconductor amplifier 122 and the DC power source 121.

The particle accelerator system 100 includes a failure detection unit 113 that detects a failure of the plurality of amplifiers 110. As shown in FIG. 7, the failure detection unit 113 is provided in each amplifier 110. The failure detection unit 113 monitors the operation status of the semiconductor amplifier 122, the DC power source, and electronic components such as a fan in the amplifier 110, and when an operation abnormality occurs in any of the electronic components, the failure detection unit 113 detects the failure of the amplifier 110. The failure detection unit 113 is connected to the control unit 101, and transmits a detection result to the control unit 101 in a case where a failure is detected. In addition, a sensor that monitors output of each amplifier 110 may be adopted as the failure detection unit 113. In a case where the sensor is used, the control unit 101 can detect the failure of the specific amplifier 110 in a case where the output of the specific amplifier 110 is significantly lower than the output of the other amplifiers 110. In addition, as the failure detection unit 113, a temperature sensor, a flowmeter, a water leakage sensor, or an abnormality detection monitor included in a fan or a DC power source may be adopted.

The control unit 101 controls the operation of the entire particle accelerator system 100. The control unit 101 controls the operations of the signal source 102, the first amplifying unit 103 of the amplifying unit 105, and the second amplifying unit 104 of the amplifying unit 105. The control unit 101 includes an electronic control unit (ECU) that comprehensively manages the entire particle accelerator system 100. The ECU is an electronic control unit having a central processing unit (CPU), a read only memory (ROM), a random access memory (RAM), a controller area network (CAN) communication circuit, and the like. In the ECU, for example, various functions are realized by loading a program stored in the ROM into the RAM and executing the program loaded into the RAM by the CPU. The ECU may be constituted of a plurality of electronic units.

The control unit 101 is electrically connected to a terminal 108 for a user to operate the particle accelerator system 100. The terminal 108 includes a general personal computer and the like, and includes a display which displays information to the user and an interface (a mouse, a keyboard, a touch panel) to which the user input information. The control unit 101 presents various kinds of information to the user via the terminal 108, and performs various operations based on the user's input via the terminal 108.

The control unit 101 stops the failed amplifier 110 based on the detection result of the failure detection unit 113. For example, in a case where the control unit 101 receives the detection result from the failure detection unit 113 corresponding to the failed amplifier 110, the control unit 101 transmits a control signal to the amplifier 110 to stop the operation. Further, the control unit 101 can identify the number of usable amplifiers 110 and the number of unusable amplifiers 110. The control unit 101 notifies the user of the failed amplifier 110 via the terminal 108. In a case where the failure detection unit 113 detects a failure, the amplifier 110 may immediately stop the operation for amplification without waiting for the control signal from the control unit 101.

The control unit 101 adjusts the output of each amplifier 110 based on the number of usable amplifiers 110. In a case where all the amplifiers 110 of the second amplifying unit 104 are usable, the control unit 101 adjusts the output of each amplifier 110 such that the sum of the output from all the amplifiers 110 is the high frequency power required in the cavities 5 and 6. The output at this time may be referred to as "output in a normal state". In a case where an unusable amplifier 110 occurs due to a failure, the number of usable amplifiers 110 is reduced. In this case, the control unit 101 increases the output of the remaining amplifiers 110 so as to supplement the output of the unusable amplifiers 110. That is, the control unit 101 performs adjustment so that the output of the usable amplifier 110 is higher than the output in the normal state. For example, in a case where the total number of the amplifiers 110 is N and the number of unusable amplifiers 110 is n, the control unit 101 adjusts output of each amplifier 110 so that the total output from the (N-n) amplifiers 110 is the high frequency power required in the cavities 5 and 6. When the failed amplifier 110 is restored, the entire amplifiers 110 are ready to be used again. In this case, the control unit 101 adjusts the output of each amplifier 110 to be the output in the normal state.

The control unit 101 may stop the operation of the second amplifying unit 104 when the number of unusable amplifiers 110 is a predetermined number. For example, the control unit 101 may stop the operation of the second amplifying unit 104 at the timing when "the number of unusable amplifiers 110 is n=2". At this time, the control unit 101 may issue a notification prompting replacement work of the amplifier 110.

The method by which the control unit 101 adjusts the output of each amplifier 110 is not particularly limited. For example, the control unit 101 may adjust the amplification factor of the first amplifying unit 103 according to the number of usable amplifiers 110. That is, the control unit 101 increases the output of the first amplifying unit 103 by increasing the amplification factor of the first amplifying unit 103 when the number of usable amplifiers 110 decreases. Accordingly, the signal (high frequency power amplified by the first amplifying unit 103) input to each amplifier 110 becomes large. Along with this, the output of each amplifier 110 increases. The signal of the first amplifying unit 103, which has become larger than in the normal state, is also input to the failed amplifier 110. Since the amplifier 110 has stopped the amplification operation, the amplifier 110 does not perform output.

Further, the control unit 101 may adjust the amplification factor of each amplifier 110 of the second amplifying unit 104 according to the number of the usable amplifiers 110. That is, when the number of usable amplifiers 110 decreases, the control unit 101 increases the amplification factor per amplifier 110 itself, thereby increasing the output of each amplifier 110. The control unit 101 may adjust the amplification factors of the entire amplifiers 110. In this case, the amplification factor of the failed amplifier 110 also becomes higher than that in the normal state, but since the amplifier 110 has stopped the amplification operation, the amplifier does not perform output. The control unit 101 may not adjust the amplification factor of the failed amplifier 110, but may adjust only the amplification factor of the usable amplifier 110.

At what timing the control unit 101 performs the above-described output adjustment control is not particularly limited. For example, the control unit 101 may adjust the output of each amplifier 110 based on the detection result of the failure detection unit 113. Specifically, when the control unit 101 receives the detection result of the failure of the specific amplifier 110 from the failure detection unit 113, the control unit 101 identifies that the output of the second amplifying unit 104 is reduced by the number of the failed amplifiers 110. Therefore, the control unit 101 adjusts the output of each amplifier 110 to be higher than the output in the normal state so that the output that is required by the remaining usable amplifiers 110 can be obtained.

Further, in a case where the voltage detected by the voltage detection unit 109 decreases due to the presence of the unusable amplifier 110, the control unit 101 may adjust the output of each amplifier 110 so that the voltage becomes a predetermined set value. In a state where the entire amplifiers 110 is usable, the voltage detected by the voltage detection unit 109 has a rated value. On the other hand, when the amplifier 110 becomes unusable due to a failure, the voltage detected by the voltage detection unit 109 becomes lower than the value in the normal state, that is, the rated value. At the timing when the control unit 101 identifies that the decrease of the voltage detected by the voltage detection unit 109, the control unit adjusts the output of each amplifier 110 to be higher than the output in the normal state, and the voltage detected by the voltage detection unit 109 to be a rated value. In a case where the output adjustment control using the voltage of the voltage detection unit 109 is performed, the control unit 101 may perform control in consideration of the failure detection result from the failure detection unit 113 or may perform control without consideration.

As an example, when the voltage detected by the voltage detection unit 109 decreases, the control content in a case where the control unit 101 adjusts the output of the first amplifying unit 103 will be described. When the voltage detected by the voltage detection unit 109 decreases due to the presence of the unusable amplifier 110, the control unit 101 adjusts the output of each amplifier 110 so that the voltage becomes a predetermined set value. The control unit 101 acquires the detection result of the voltage detection unit 109 via a line L2. At the timing when the control unit 101 identifies that the decrease of the voltage detected by the voltage detection unit 109, the control unit 101 adjusts the amplification factor of the first amplifying unit 103 so that the voltage detected by the voltage detection unit 109 is to be the rated value. When adjusting the amplification factor of the first amplifying unit 103, the amplification factor may be repeatedly adjusted until the value of the voltage detection unit 109 reaches the rated value. Alternatively, how much the value of the voltage detection unit 109 deviates from the rated value is identified, how much the amplification factor should be increased from the deviation is calculated, and the amplification factor may be changed based on the calculation result. Further, the adjustment process of the amplification factor may be performed by the control unit included inside the first amplifying unit 103 itself. In this case, the first amplifying unit 103 acquires the detection result of the voltage detection unit 109 via a line L1. Then, the first amplifying unit 103 performs the same process as the above-described adjustment of the amplification factor by the internal control unit. At this time, the control unit included in the first amplifying unit 103 functions as a part of the "control unit" in the claims. The control as described above may be performed based on the user's input in the terminal 108. For example, the control unit 101 (or the control unit inside the first amplifying unit 103) may perform the control based on a display of the inoperable amplifier 110 on the terminal 108 and an input instruction by a user.

Next, operations and effects of the particle accelerator system 100 according to this embodiment will be described.

Figure 8:
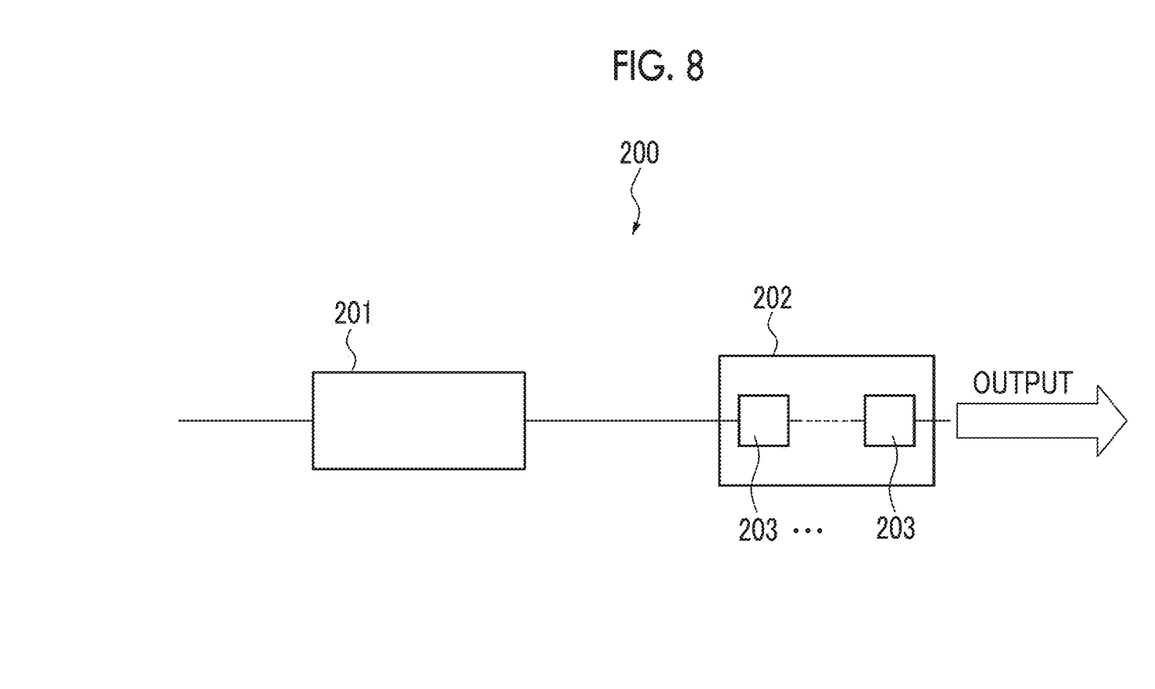
FIG. 8 is a block diagram showing an amplifying unit according to a comparative example.

First, the amplifying unit 200 according to the comparative example will be described with reference to FIG. 8. The amplifying unit 200 includes a preamplifier 201 and a main amplifier 202. Further, the main amplifier 202 includes an amplifier 203 using a vacuum tube. When a plurality of amplifiers 203 using the vacuum tubes are used, the amplifiers 203 are connected in series. Therefore, in a case where any of the plurality of amplifiers 203 fails, it is necessary to stop the entire amplifying unit 200, and it is necessary to stop the operation of the cyclotron itself.

On the other hand, the particle accelerator system 100 according to the present embodiment includes the amplifying unit 105 that amplifies the high frequency power from the signal source 102. Further, the amplifying unit 105 includes a plurality of amplifiers 110 using semiconductors, and a combiner 111 that combines output from each amplifier 110. By adopting the amplifier 110 using a semiconductor, the amplifying unit 105 can amplify the high frequency power from the signal source 102 in parallel with the plurality of amplifiers 110. Then, the amplifying unit 105 can supply a large amount of power to the cyclotron by combining the output from each amplifier 110 by the combiner 111. Here, for example, when parts of the plurality of amplifiers 110 fail and become unusable, the high frequency power supplied to the cyclotron is reduced. On the other hand, the control unit 101 adjusts the output of each amplifier 110 based on the number of usable amplifiers 110. The control unit 101 can control the output so that the remaining non-failed amplifiers 110, that is, the usable amplifiers 110, supplement the output of the failed amplifier 110. Accordingly, the amplifying unit 105 can continuingly supply the high frequency power required for the operation of the cyclotron 1 without stopping the cyclotron. As described above, the operating efficiency of the cyclotron 1 can be improved.

In addition, the amplifying unit 105 includes the first amplifying unit 103 that amplifies the high frequency power from the signal source 102, the second amplifying unit 104 including a plurality of amplifiers 110, and the distribution unit 140 that distributes the output of the first amplifying unit 103 to each amplifier 110 of the second amplifying unit 104. The control unit 101 may adjust the amplification factor of the first amplifying unit 103 according to the number of the usable amplifiers 110. Therefore, the control unit 101 can collectively adjust the plurality of amplifiers 110 only by adjusting the output of the first amplifying unit 103. In this case, when adjusting the individual amplifiers 110, the adjustment of output becomes easy.

The amplifying unit 105 includes the first amplifying unit 103 that amplifies the high frequency power from the signal source 102, the second amplifying unit 104 including the plurality of amplifiers 110, and the distribution unit 140 that distributes the output of the first amplifying unit 103 to each amplifier 110 of the second amplifying unit 104. The control unit 101 may adjust the amplification factor of each amplifier 110 of the second amplifying unit 104 according to the number of the usable amplifiers 110.

The particle accelerator system 100 further includes a failure detection unit 113 that detects a failure of the plurality of amplifiers 110, and the control unit 101 may adjust the output of each amplifier 110 based on the detection result of the failure detection unit 113. In this case, the control unit 101 can directly identify the failure status of the plurality of amplifiers 110 and then adjust the output of the amplifiers 110.

The particle accelerator is a cyclotron 1, the cyclotron 1 has cavities 5 and 6 to which the high frequency power amplified by the amplifying unit 105 is supplied, and the cavities 5 and 6 are provided with the voltage detection unit 109 that detects the voltage in the cavities 5 and 6. In a case where the voltage detected by the voltage detection unit 109 decreases due to the presence of the unusable amplifiers 110, the control unit 101 adjusts output of each amplifier 110 so that the voltage is to be a predetermined set value. In this way, the control unit 101 adjusts the output of the amplifier 110 based on the voltage in the cavities 5 and 6, and thus the voltage required in the cavities 5 and 6 can be accurately ensured.

The present invention is not limited to the above-described embodiments. For example, the particle accelerator is not limited to the cyclotron, and a linear accelerator or a synchrotron may be adopted.

It should be understood that the invention is not limited to the above-described embodiment, but may be modified into various forms on the basis of the spirit of the invention. Additionally, the modifications are included in the scope of the invention.

What is claimed is:

1. A particle accelerator system comprising:
    a particle accelerator that accelerates charged particles;
    a signal source that outputs high frequency power for accelerating the charged particles in the particle accelerator;
    an amplifying unit that amplifies the high frequency power from the signal source, and supplies the high frequency power to the particle accelerator, the amplifying unit including a plurality of semiconductor amplifiers using a semiconductor; and
    a control unit that controls an operation of the amplifying unit,
    wherein the control unit controls output of at least one of the plurality of semiconductor amplifiers, wherein the particle accelerator is a cyclotron,
    wherein the cyclotron has a cavity to which the high frequency power amplified by the amplifying unit is supplied,
    wherein the cavity is provided with a voltage detection unit that detects a voltage in the cavity, and
    wherein in a case where the voltage detected by the voltage detection unit decreases due to a presence of an unusable semiconductor amplifier, the control unit controls output of each of the semiconductor amplifiers such that the voltage becomes a predetermined set value.

2. The particle accelerator system according to claim 1, wherein the control unit controls the output of at least one of the plurality of semiconductor amplifiers based on the number of usable semiconductor amplifiers.

3. The particle accelerator system according to claim 1, wherein the amplifying unit includes
    a first amplifying unit that amplifies the high frequency power from the signal source,
    a second amplifying unit that includes the plurality of semiconductor amplifiers, and
    a distribution unit that distributes output of the first amplifying unit to each of the semiconductor amplifiers of the second amplifying unit, and
    wherein the control unit controls an amplification factor in the first amplifying unit according to the number of usable semiconductor amplifiers.

4. The particle accelerator system according to claim 1, wherein the amplifying unit includes
    a first amplifying unit that amplifies the high frequency power from the signal source,
    a second amplifying unit that includes the plurality of semiconductor amplifiers, and
    a distribution unit that distributes output of the first amplifying unit to each of the semiconductor amplifiers of the second amplifying unit, and
    wherein the control unit controls an amplification factor in each of the semiconductor amplifiers of the second amplifying unit according to the number of usable semiconductor amplifiers.

5. The particle accelerator system according to claim 1, further comprising a failure detection unit that detects a failure of the plurality of semiconductor amplifiers,
    wherein the control unit controls output of each of the semiconductor amplifiers based on a detection result of the failure detection unit.

6. The particle accelerator system according to claim 1, wherein the amplifying unit includes a combiner that combines output from each of the semiconductor amplifiers.

7. The particle accelerator system according to claim 6, wherein each of the semiconductor amplifiers is connected to a DC power source.

8. A particle accelerator system comprising:
    a particle accelerator that accelerates charged particles;
    a signal source that outputs high frequency power for accelerating the charged particles in the particle accelerator;
    an amplifying unit that amplifies the high frequency power from the signal source, and supplies the high frequency power to the particle accelerator, the amplifying unit including a plurality of semiconductor amplifiers using a semiconductor; and
    a control unit that controls an operation of the amplifying unit,
    wherein the control unit controls output of at least one of the plurality of semiconductor amplifiers,
    wherein each of the semiconductor amplifiers is connected to a DC power source,
    wherein the particle accelerator is a cyclotron,
    wherein the cyclotron has a cavity to which the high frequency power amplified by the amplifying unit is supplied,
    wherein the cavity is provided with a voltage detection unit that detects a voltage in the cavity, and
    wherein in a case where the voltage detected by the voltage detection unit decreases due to a presence of an unusable semiconductor amplifier, the control unit controls output of each of the semiconductor amplifiers such that the voltage becomes a predetermined set value.

* * * * *

UNITED STATES PATENT AND TRADEMARK OFFICE
CERTIFICATE OF CORRECTION

| | | |
|---|---|---|
| PATENT NO. | : 11,690,163 B2 | Page 1 of 1 |
| APPLICATION NO. | : 16/918676 | |
| DATED | : June 27, 2023 | |
| INVENTOR(S) | : Nobuaki Takahashi et al. | |

It is certified that error appears in the above-identified patent and that said Letters Patent is hereby corrected as shown below:

On the Title Page

At (30):
Please insert:
--Jul. 1, 2019 (JP)....................2019-123141--

Signed and Sealed this
Fifth Day of November, 2024

Katherine Kelly Vidal
*Director of the United States Patent and Trademark Office*